United States Patent
Lee

(10) Patent No.: US 8,270,243 B2
(45) Date of Patent: Sep. 18, 2012

(54) INTERNAL COMMAND GENERATION DEVICE

(75) Inventor: Seong Seop Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 118 days.

(21) Appl. No.: 12/836,738

(22) Filed: Jul. 15, 2010

(65) Prior Publication Data

US 2011/0156768 A1 Jun. 30, 2011

(30) Foreign Application Priority Data

Dec. 24, 2009 (KR) .................. 10-2009-0131272

(51) Int. Cl.
*G11C 7/00* (2006.01)
(52) U.S. Cl. ............... 365/222; 365/191; 365/230.06; 327/142
(58) Field of Classification Search .......... 365/222, 365/191; 327/142
See application file for complete search history.

(56) References Cited

U.S. PATENT DOCUMENTS

| | | | | |
|---|---|---|---|---|
| 5,894,446 A | * | 4/1999 | Itou | 365/222 |
| 7,145,823 B2 | | 12/2006 | Jain et al. | |
| 7,701,790 B2 | * | 4/2010 | Do et al. | 365/203 |
| 2003/0185078 A1 | * | 10/2003 | Tsukude | 365/222 |
| 2007/0070727 A1 | * | 3/2007 | Do et al. | 365/191 |
| 2008/0239853 A1 | * | 10/2008 | Chun | 365/222 |
| 2009/0279373 A1 | * | 11/2009 | Han | 365/222 |
| 2009/0323436 A1 | * | 12/2009 | Lee | 365/189.07 |
| 2010/0149891 A1 | * | 6/2010 | Do et al. | 365/191 |

FOREIGN PATENT DOCUMENTS

| | | |
|---|---|---|
| KR | 1020070036631 A | 4/2007 |
| KR | 100761403 B1 | 9/2007 |

* cited by examiner

*Primary Examiner* — Ryan Jager
(74) *Attorney, Agent, or Firm* — Ladas & Parry LLP

(57) ABSTRACT

The initial command generation device includes a first flag signal generation unit configured to generate a reset flag signal setting a reset period in response to a reset command, an initial pulse signal generation unit configured to generate a first initial pulse signal and a second initial pulse signal in response to the reset flag signal, a second flag signal generation unit configured to generate a device auto initialization flag signal setting a device auto initialization period in response to the first initial pulse signal and an internal command generation unit configured to generate an internal refresh command enabled within the device auto initialization period in response to the second initial pulse signal.

16 Claims, 15 Drawing Sheets

US 8,270,243 B2

INTERNAL COMMAND GENERATION DEVICE

CROSS-REFERENCES TO RELATED APPLICATIONS

The present application claims priority under 35 U.S.C 119(a) to Korean application number 10-2009-0131272, filed on Dec. 24, 2009, in the Korean intellectual property Office, which is incorporated herein by reference in its entirety set forth in full.

BACKGROUND

Exemplary embodiments of the present invention relate to an internal command generation device.

A semiconductor memory device receives an external voltage (VDD) and a ground voltage (VSS) and converts the received external voltage (VDD) and ground voltage (VSS) into internal voltages necessary for internal operations. Examples of the internal voltages necessary for the internal operations of the semiconductor device include a core voltage (VCORE) supplied to a core region, a high voltage (VPP) supplied for driving a word line, a cell plate voltage (VCP) supplied to a plate electrode of a capacitor, and a bit line precharge voltage (VBLP) supplied to a bit line pair BL and BLB during a precharge operation.

When a semiconductor memory device enters a power-up mode (power ramp sequence), an internal voltage rises until it reaches a predetermined level along a level of an external voltage (VDD). Thus, a process of stabilizing an internal voltage is required before the start of a normal operation such as a read or write operation. The stabilization of the internal voltage is achieved through the continuous use of the internal voltage. Therefore, a typical SDRAM stabilizes an internal voltage by performing a refresh operation in response to the input of an external refresh command.

Meanwhile, as described in the specification, an LPDDR2 RAM receives an external reset command and sets a device auto initialization period of approximately 10 μs after entering a reset state. Like an SDRAM, no refresh command is inputted in the device auto initialization of the LPDDR2 RAM. Consequently, there is no way to stabilize the internal voltage.

SUMMARY

An embodiment of the present invention relates to an internal command generation device of a semiconductor memory device, which stabilizes an internal voltage by generating an internal refresh command and performing a refresh operation.

In one embodiment, an internal command generation device includes: a first flag signal generation unit configured to generate a reset flag signal setting a reset period in response to a reset command; an initial pulse signal generation unit configured to generate a first initial pulse signal and a second initial pulse signal in response to the reset flag signal; a second flag signal generation unit configured to generate a device auto initialization flag signal setting a device auto initialization period in response to the first initial pulse signal; and an internal command generation unit configured to generate an internal refresh command enabled within the device auto initialization period in response to the second initial pulse signal.

In another embodiment, an internal command generation device includes: a first flag signal generation unit configured to generate a reset flag signal setting a reset period in response to a reset command; a first initial pulse signal generation unit configured to generate a first initial pulse signal in response to the reset flag signal; a second flag signal generation unit configured to generate a device auto initialization flag signal setting a device auto initialization period in response to the first initial pulse signal; a counting unit configured to generate a counting signal when a second initial pulse signal is generated a preset number of times; a second initial pulse signal generation unit configured to generate the second initial pulse signal in response to the first initial pulse signal and the internal refresh command, and stop generating the second initial pulse signal in response to the counting signal; and an internal command generation unit configured to generate the internal refresh command within the device auto initialization period in response to the second initial pulse signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of the invention.

Figure 1:
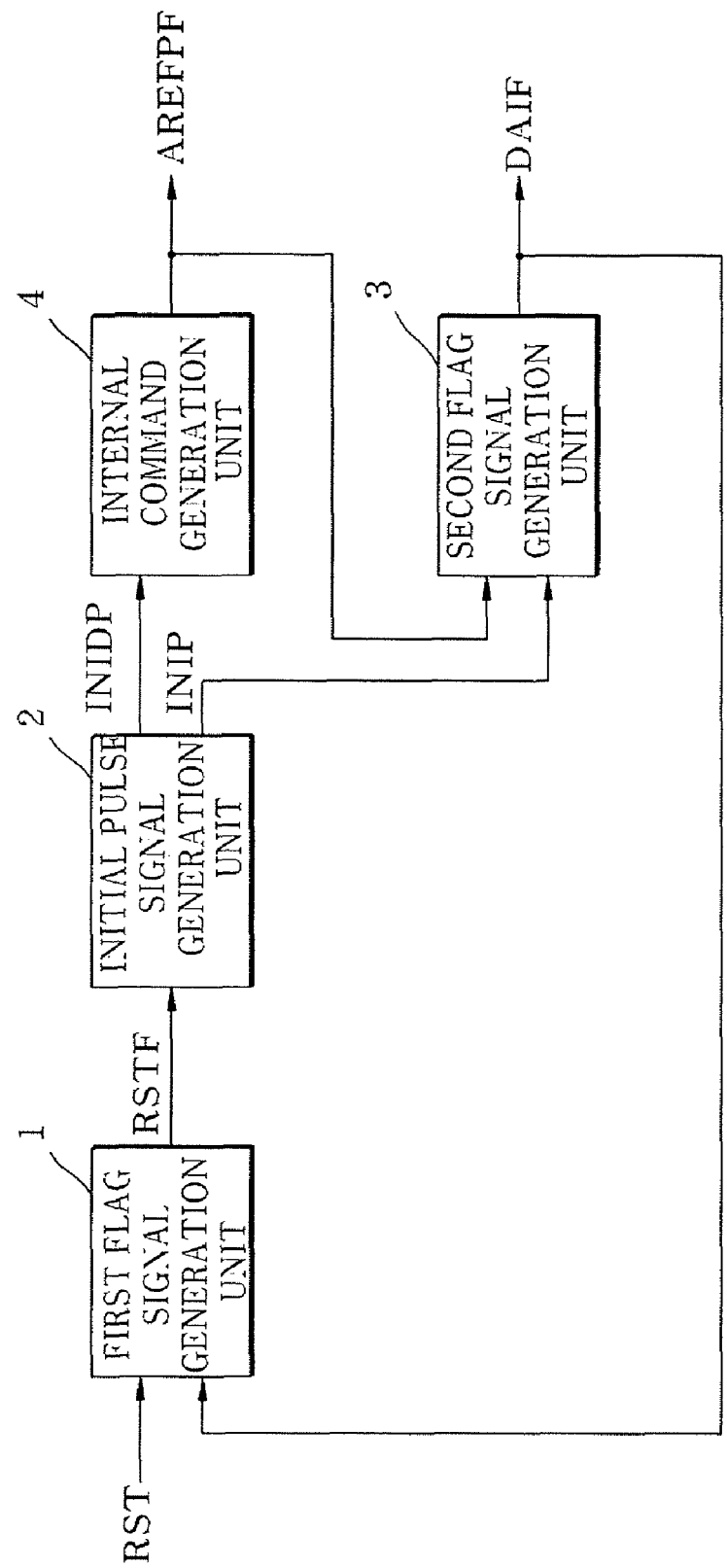
FIG. 1 is a block diagram illustrating an internal command generation device according to an embodiment of the present invention.

FIG. 1 is a block diagram illustrating an internal command generation device according to an embodiment of the present invention.

Referring to FIG. 1, the internal command generation unit includes a first flag signal generation unit 1, an initial pulse signal generation unit 2, a second flag signal generation unit 3, and an internal command generation unit 4.

Figure 2:
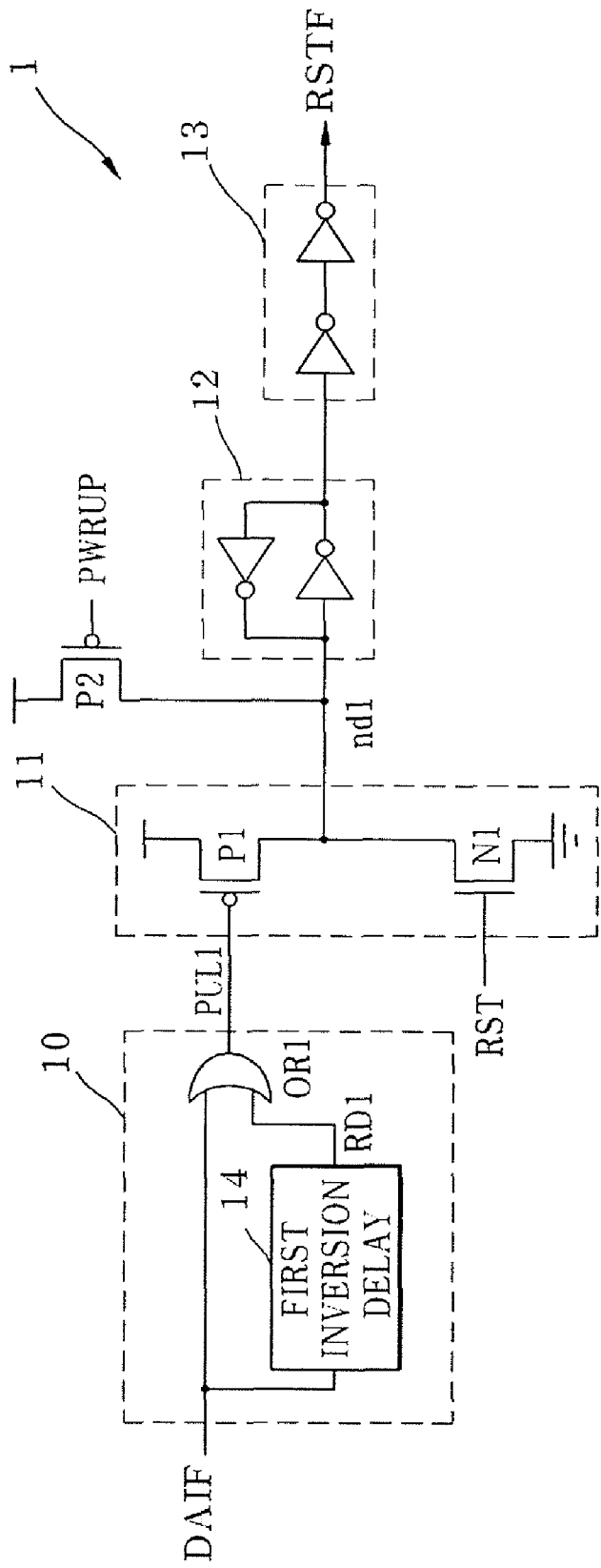
FIG. 2 is a circuit diagram illustrating a first flag signal generation unit of FIG. 1.

As illustrated in FIG. 2, the first flag signal generation unit 1 includes a first pulse generation section 10, a first driving section 11, a first latch section 12, and a first buffer section 13. The first pulse generation section 10 includes a first inversion delay 14 and a first OR gate OR1. The first inversion delay 14 is configured to invert and delay a device auto initialization flag DAIF signal and output a first inversion delay signal RD1. The first OR gate OR1 is configured to perform an OR operation on the DAIF and RD1 signals and to subsequently generate a pulse of a first pulse signal PUL1. The first driving section 11 includes a first PMOS transistor P1 and a first NMOS transistor N1. The first PMOS transistor P1 is configured to operate as a pull-up element to pull-up drive a first node nd1 in response to the first pulse signal PUL1. The first NMOS transistor N1 is configured to operate as a pull-down element to pull-down drive the first node nd1 in response to a reset command RST. The first latch section 12 is configured with an inverter type latch configuration which latches a signal of the first node nd1. The first buffer section 13 is configured with an inverter-type buffer which delays and buffers an output signal of the first latch section 12. The first flag signal generation unit 1 further includes a second PMOS transistor P2 configured to operate as a reset element which resets the first node nd1 in response to a power-up signal PWRUP. The reset command RST is a command which allows the semiconductor memory device to enter a reset state in a specific situation. An example of the specific situation is a case in which an external controller malfunctions and therefore only the external controller is rebooted. In this case, transfers the reset command RST to the semiconductor memory device and allows the semiconductor memory device to enter the reset state.

The first flag signal generation unit 1 configured as above enables a reset flag signal RSTF to a high level when the pulse of the reset command RST is generated, and disables the reset flag signal RSTF to a low level when the device auto initialization flag signal DAIF is disabled to a low level. Specifically, when the pulse of the reset command RST is generated, the first NMOS transistor N1 of the first driving section 11 is driven to pull down the first node nd1 to a low level. The first latch section 12 latches and inverts the low level signal of the first node nd1, and the first buffer section 13 delays and buffers the output signal of the first latch section 12 and enables the reset flag signal RSTF to a high level. When the device auto initialization flag signal DAIF is disabled to a low level, the first pulse generation section 10 generates the pulse of the first pulse signal PUL1 and drives the first PMOS transistor P1 of the first driving section 11. Therefore, the first node nd1 is pulled up to a high level. The first latch section 12 latches and inverts the high level signal of the first node nd1, and the first buffer section 13 delays and buffers the output signal of the first latch section 12 and disables the reset flag signal RSTF to a low level.

Figure 3:
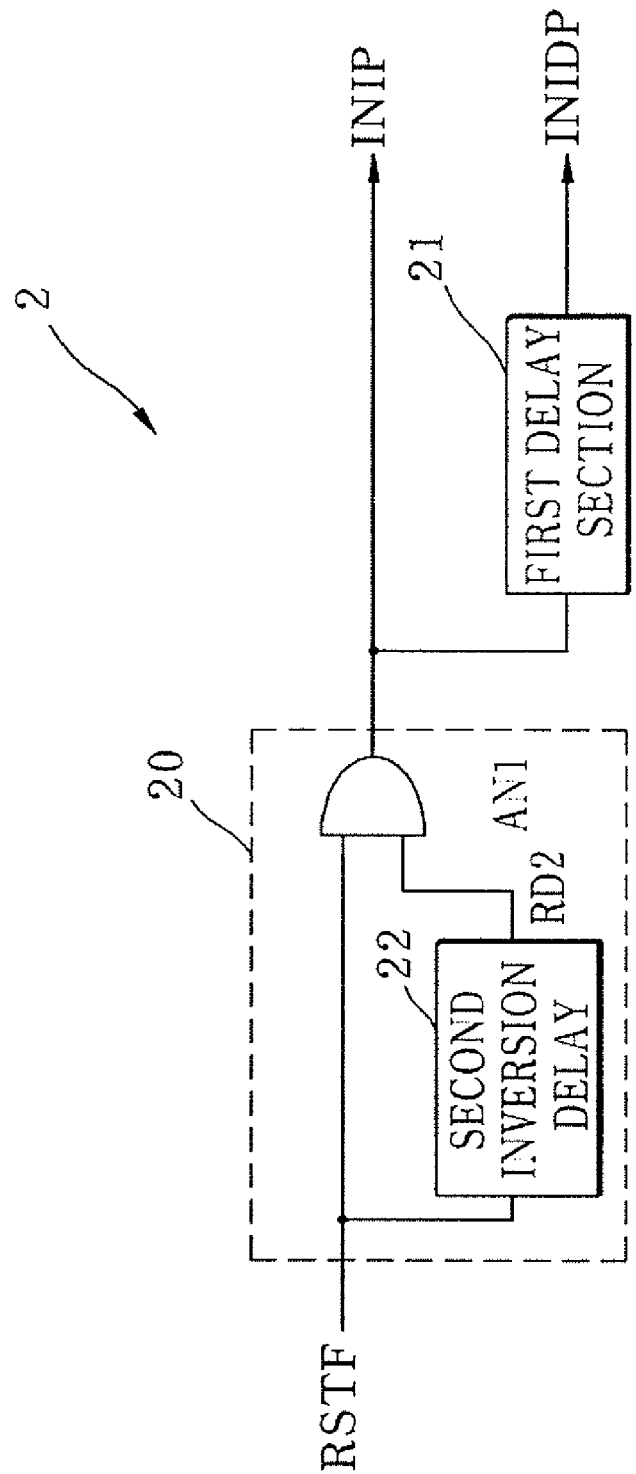
FIG. 3 is a circuit diagram illustrating an initial pulse signal generation unit of FIG. 1.

As illustrated in FIG. 3, the initial pulse signal generation unit 2 includes a second pulse generation section 20 and a first delay unit 21. The second pulse generation section 20 includes a second inversion delay 22 and a first AND gate AN1. The second inversion delay 22 is configured to invert and delay the reset flag signal RSTF and output a second inversion delay signal RD2. The first AND gate AN1 is configured to perform an AND operation on the reset flag signal RSTF and the second inversion delay signal RD2 and generate a pulse of a first initial pulse signal INIP. The first delay section 21 is configured to delays the first initial pulse signal INIP by a preset delay time and output a second initial pulse signal INIDP.

The initial pulse signal generation unit 2 configured as above generates the pulse of the first initial pulse signal INIP in response to the reset flag signal RSTF which is enabled to a high level, delays the first initial pulse signal INIP by the delay time of the first delay section 21, and generates the pulse of the second initial pulse signal INIDP.

Figure 4:
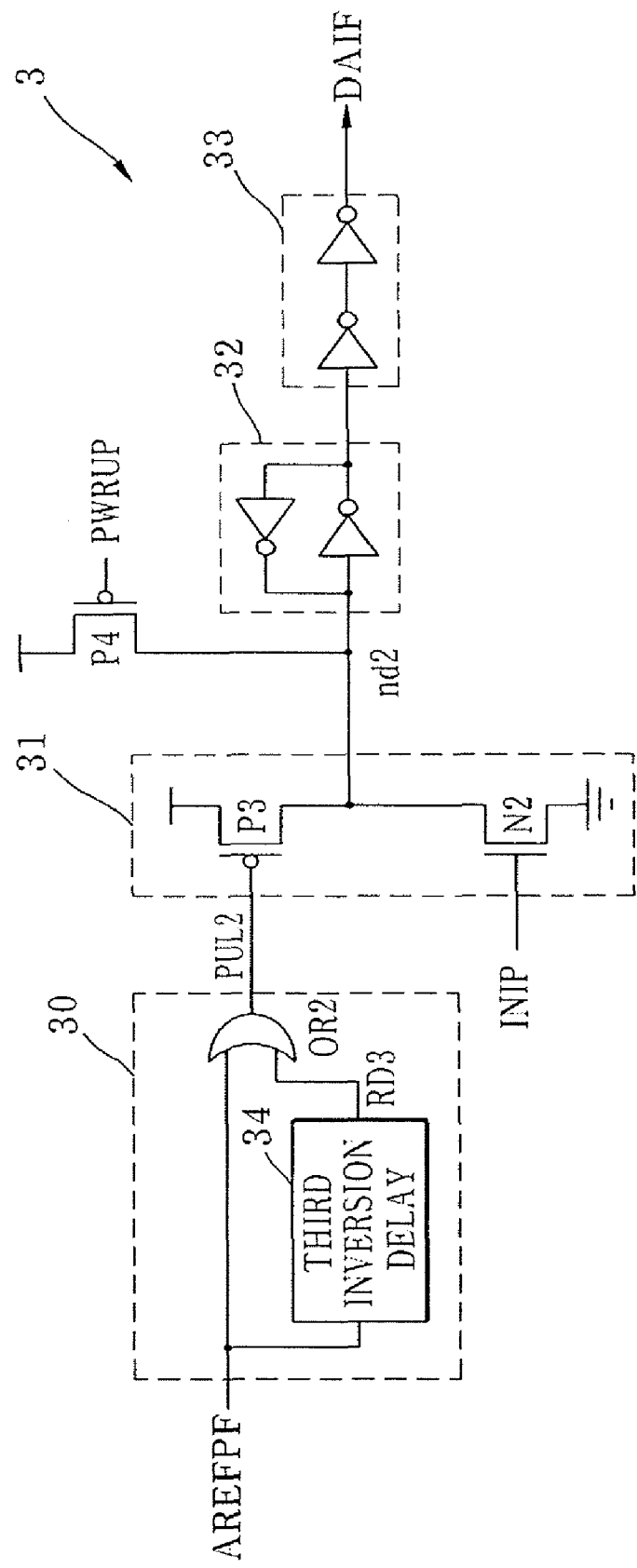
FIG. 4 is a circuit diagram illustrating a second flag signal generation unit of FIG. 1.

As illustrated in FIG. 4, the second flag signal generation unit 3 includes a third pulse generation section 30, a second driving section 31, a second latch section 32, and a second buffer section 33.

The third pulse generation section 30 includes a third inversion delay 34 and a second OR gate OR2. The third inversion delay 34 is configured to invert and delay an internal refresh command AREFPF and output a third inversion delay signal RD3. The second OR gate OR2 is configured to perform an OR operation on the internal refresh command AREFPF and the third inversion delay signal RD3 and generate a pulse of a second pulse signal PUL2. The second driving section 31 includes a second NMOS transistor N2 and a third PMOS transistor P3. The second NMOS transistor N2 is configured to operate as a pull-down element to pull-down drive a second node nd2 in response to the first initial pulse signal INIP. The third PMOS transistor P3 is configured to operate as a pull-up element to pull-up drive the second node nd2 in response to the second pulse signal PUL2. The second latch section 32 is configured with an inverter type latch which latches a signal of the second node nd2. The second buffer section 33 is configured with an inverter-type buffer which delays and buffers an output signal of the second latch section 32 and outputs the device auto initialization flag signal DAIF. The second flag signal generation unit 3 further includes a fourth PMOS transistor P4 configured to operate as a reset element which resets the second node nd2 in response to the power-up signal PWRUP.

The second flag signal generation unit 3 configured as above enables the device auto initialization flag signal DAIF to a high level when the pulse of the first initial pulse signal INIP is generated, and disables the device auto initialization flag signal DAIF to a low level when the initial refresh command AREFPF is disabled to a low level. Specifically, when the pulse of the first initial pulse signal INIP is generated, the second NMOS transistor N2 of the second driving section 31 is driven to pull down the second node nd2 to a low level. The second latch section 32 latches and inverts the low level signal of the second node nd2, and the second buffer section 33 delays and buffers the output signal of the second latch section 32 and enables the device auto initialization flag signal DAIF to a high level. When the internal refresh command AREFPF is disabled to a low level, the second pulse generation section 30 generates the pulse of the second pulse signal PUL2 and drives the third PMOS transistor P3 of the second driving section 31. Therefore, the second node nd2 is pulled up to a high level. The second latch section 32 latches and inverts the high level signal of the second node nd2, and the second buffer section 33 delays and buffers the output signal of the second latch section 32 and disables the device auto initialization flag signal DAIF to a low level.

Figure 5:
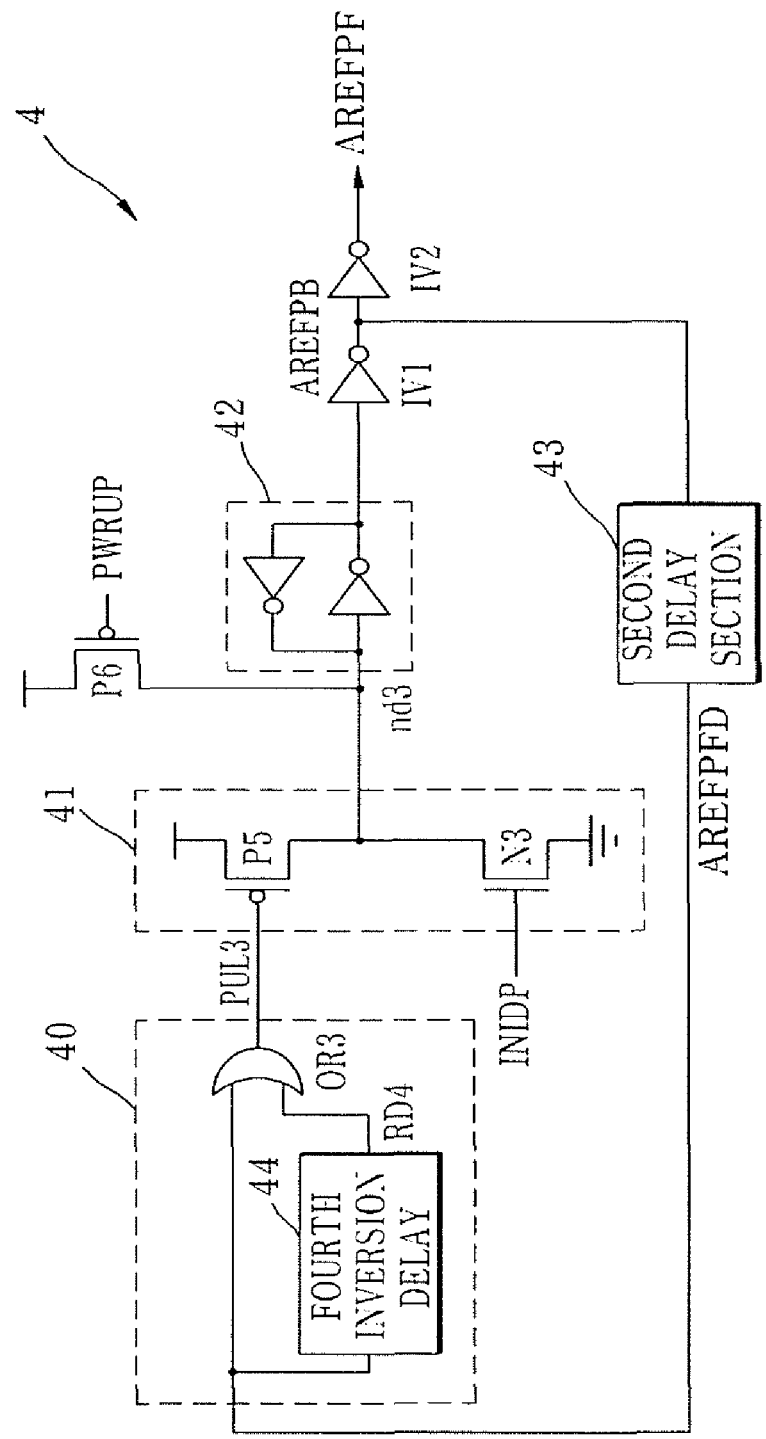
FIG. 5 is a circuit diagram illustrating an internal command generation unit of FIG. 1.

As illustrated in FIG. 5, the internal command generation unit 4 includes a fourth pulse generation section 40, a third driving section 41, a third latch section 42, first and second inverters IV1 and IV2, and a second delay section 43. The fourth pulse generation section 40 includes a fourth inversion delay 44 and a third OR gate OR3. The fourth inversion delay 44 is configured to invert and delay a first delay signal AREF-PFD and output a fourth inversion delay signal RD4. The third OR gate OR3 is configured to perform an OR operation on the first delay signal AREFPFD and the third inversion delay signal RD4. The third driving section 41 includes a third NMOS transistor N3 and a fifth PMOS transistor P5. The third NMOS transistor N3 is configured to operate as a pull-down element to pull-down drive a third node nd3 in response to the second initial pulse signal INIDP. The fifth PMOS transistor P5 is configured to operate as a pull-up element to pull-up drive the third node nd3 in response to the third pulse signal PUL3. The third latch section 42 is configured with an inverter type latch which latches a signal of the third node nd3. The first and second inverters IV1 and IV2 are configured to delay and buffer an output signal of the third latch section 42 and output the internal refresh command AREFPF. Specifically, the first inverter IV1 is configured to invert the output signal of the third latch section 42 and output a pre internal refresh command AREFPB. The second inverter IV2 is configured to invert the pre internal refresh command AREFPB and output the internal refresh command AREFPF. The second delay section 43 is configured to delay the pre internal refresh command AREFPB by a refresh time (tRFC) and output the first delay signal AREFPFD. The internal command generation unit 4 further includes a sixth PMOS transistor P6 configured to operate as a reset element to reset the third node nd3 in response to the power-up signal PWRUP. The internal refresh command AREFPF is an internal command for performing a refresh operation, and is enabled for the refresh time (tRFC).

The internal command generation unit 4 configured as above enables the internal refresh command AREFPF to a high level when the pulse of the second initial pulse signal INIDP is generated, and disables the internal refresh command AREFPF to a low level after the elapse of the refresh time (tRFC). Specifically, when the pulse of the second initial pulse signal INIDP is generated, the third NMOS transistor N3 of the third driving section 41 is driven to pull down the third node nd3 to a low level. The third latch section 42 latches and inverts the low level signal of the third node nd3, and the first and second inverters IV1 and IV2 delay and buffer the output signal of the third latch section 42 and enable the internal refresh command AREFPF to a high level. When the pulse of the third pulse signal PUL3 is generated at a timing in which the first delay signal AREFPFD generated by delaying the pre internal refresh command AREFPB outputted from the first inverter IV1 by the refresh time (tRFC) is enabled to a low level, the fifth PMOS transistor P5 of the third driving section 41 is driven to pull up the third node nd3 to a high level. The driving latch section 42 latches and inverts the high level signal of the third node nd3, and the first and second inverters IV1 and IV2 delay and buffer the output signal of the third latch section 42 and disable the internal refresh command AREFPF to a low level.

Figure 6:
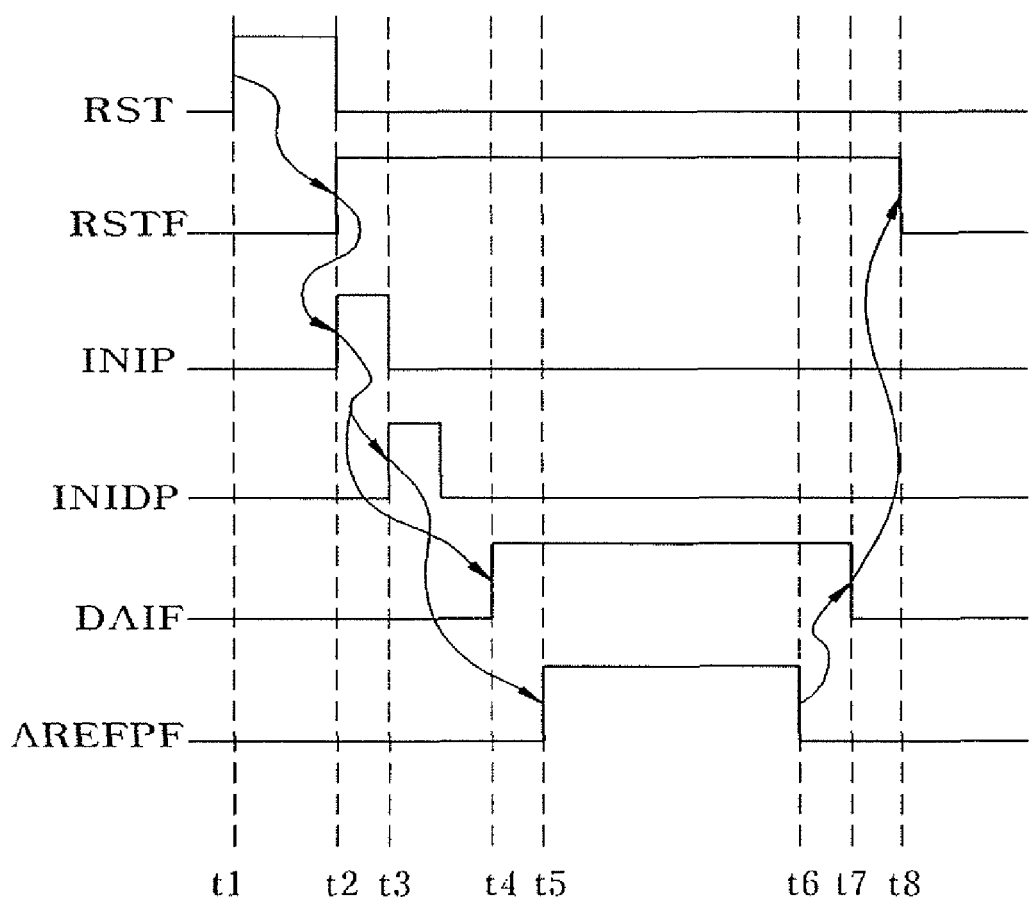
FIG. 6 is a timing diagram illustrating the operation of the internal command generation device of FIG. 1.

The operation of the internal command generation device will be described below with reference to FIG. 6.

First, when the pulse of the reset command RST is inputted at time t1, the first flag signal generation unit 1 enables the reset flag signal RSTF to a high level at time t2. Specifically, when the pulse of the reset command RST is inputted at time t1, the first driving section 11 is driven to pull down the first node nd1 to a low level. The first latch section 12 latches and inverts the low level signal of the first node nd1, and the first buffer section 13 delays and buffers the output signal of the first latch section 12 and enables the reset flag signal RSTF to a high level at time t2. The reset period is started in response to the reset flag signal RSTF which is enabled to a high level.

Next, when the reset flag signal RSTF is enabled to a high level at time t2, the initial pulse signal generation unit 2 generates the pulse of the first initial pulse signal INIP at time t2, delays the pulse of the first initial pulse signal INIP by the delay time of the first delay section 21, and generates the pulse of the second initial pulse signal INIDP at time t3. Therefore, the second initial pulse signal INIDP is generated later than the first initial pulse signal INIP.

Next, when the pulse of the first initial pulse signal INIP is generated at time t2, the second flag signal generation unit 3 enables the device auto initialization flag signal DAIF to a high level at time t4. Specifically, when the pulse of the first initial pulse signal INIP is generated at time t2, the second driving section 31 is driven to pull down the second node nd2 to a low level. The second latch section 32 latches and inverts the low level signal of the second node nd2, and the second buffer section 33 delays and buffers the output signal of the second latch section 32 and enables the device auto initialization flag signal DAIF to a high level at time t4. The device auto initialization period is started in response to the device auto initialization flag signal DAIF which is enabled to a high level.

Next, when the pulse of the second initial pulse signal INIDP is generated at time t3, the internal command generation unit 4 enables the internal refresh command AREFPF to a high level at time t5, and disables the internal refresh command AREFPF to a low level at time t6 after the elapse of the refresh time (tRFC). Specifically, when the pulse of the second initial pulse signal INIDP is generated at time t3, the third driving section 41 is driven to pull down the third node nd3 to a low level. The third latch section 42 latches and inverts the low level signal of the third node nd3, and the first and second inverters IV1 and IV2 delay and buffer the output signal of the third latch section 42 and enable the internal refresh command AREFPF to a high level at time t5. When the pulse of the third pulse signal PUL3 is generated at a timing where the first delay signal AREFPFD generated by delaying the pre internal refresh command AREFPB outputted from the first inverter IV1 by the refresh time is enabled to a low level, the third driving section 41 is driven to pull up the third node nd3 to a high level. The third latch section 42 latches and inverts the high level signal of the third node nd3, and the first and second inverters IV1 and IV2 delay and buffer the output signal of the third latch section 42 and disable the internal refresh command AREFPF to a low level at time t6.

Next, when the internal refresh command AREFPF is disabled to a low level at time t6, the second flag signal generation unit 3 disables the device auto initialization flag signal DAIF to a low level at time t7. Specifically, when the internal refresh command AREFPF is disabled to a low level at time t6, the second pulse generation section 30 generates the pulse of the second pulse signal PUL2 and drives the third PMOS transistor P3 of the second driving section 31. Therefore, the second node nd2 is pulled up to a high level. The second latch section 32 latches and inverts the high level signal of the second node nd2, and the second buffer section 33 delays and buffers the output signal of the second latch section 32 and disables the device auto initialization flag signal DAIF to a low level at time t7. The device auto initialization period is terminated in response to the device auto initialization flag signal DAIF which is disabled to a low level. Specifically, the device auto initialization period is t4 to t7 at which the device auto initialization flag signal DAIF is enabled.

Next, when the device auto initialization flag signal DAIF is disabled to a low level at time t7, the first flag signal generation unit 1 disables the reset flag signal RSTF to a low level at time t8. Specifically, when the device auto initialization flag signal DAIF is disabled to a low level at time t7, the first pulse generation section 10 generates the pulse of the first pulse signal PUL1 and drives the first PMOS transistor P1 of the first driving section 11. Therefore, the first node nd1 is pulled up to a high level. The first latch section 12 latches and inverts the high level signal of the first node nd1, and the first buffer section 13 delays and buffers the output signal of the first latch section 12 and disables the reset flag signal RSTF to a low level at time t8. The reset period is terminated in response to the reset flag signal RSTF which is disabled to a low level. Specifically, the reset period is t2 to t8 at which the reset flag signal RSTF is enabled.

In summary, the internal command generation device according to the embodiment of the present invention sets the reset period and the device auto initialization period by sequentially generating the reset flag signal RSTF and the device auto initialization flag signal DAIF when the pulse of the reset command RST is inputted, and guides the refresh operation by generating the internal refresh command AREFPF within the device auto initialization period. Therefore, when the reset command is inputted, the internal command generation device according to the embodiment of the present invention stabilizes the internal voltage by generating the internal refresh command AREFPF and performing the refresh operation.

Figure 7:
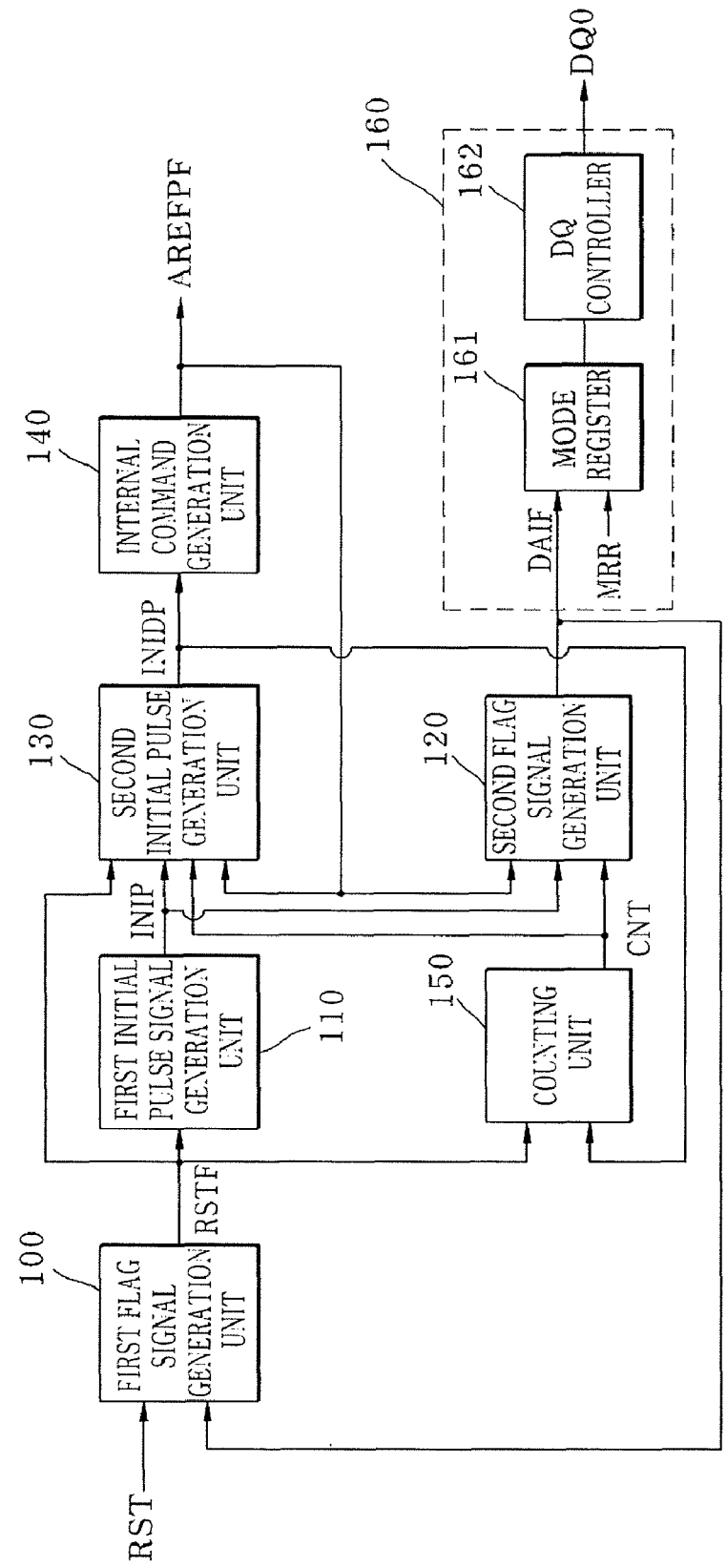
FIG. 7 is a block diagram illustrating an internal command generation device according to another embodiment of the present invention.

FIG. 7 is a block diagram illustrating an internal command generation device according to another embodiment of the present invention.

Referring to FIG. 7, the internal command generation device includes a first flag signal generation unit 100, a first initial pulse signal generation unit 110, a second flag signal generation unit 120, a second initial pulse signal generation unit 130, an internal command generation unit 140, a counting unit 150, and a state signal generation unit 160.

Figure 8:
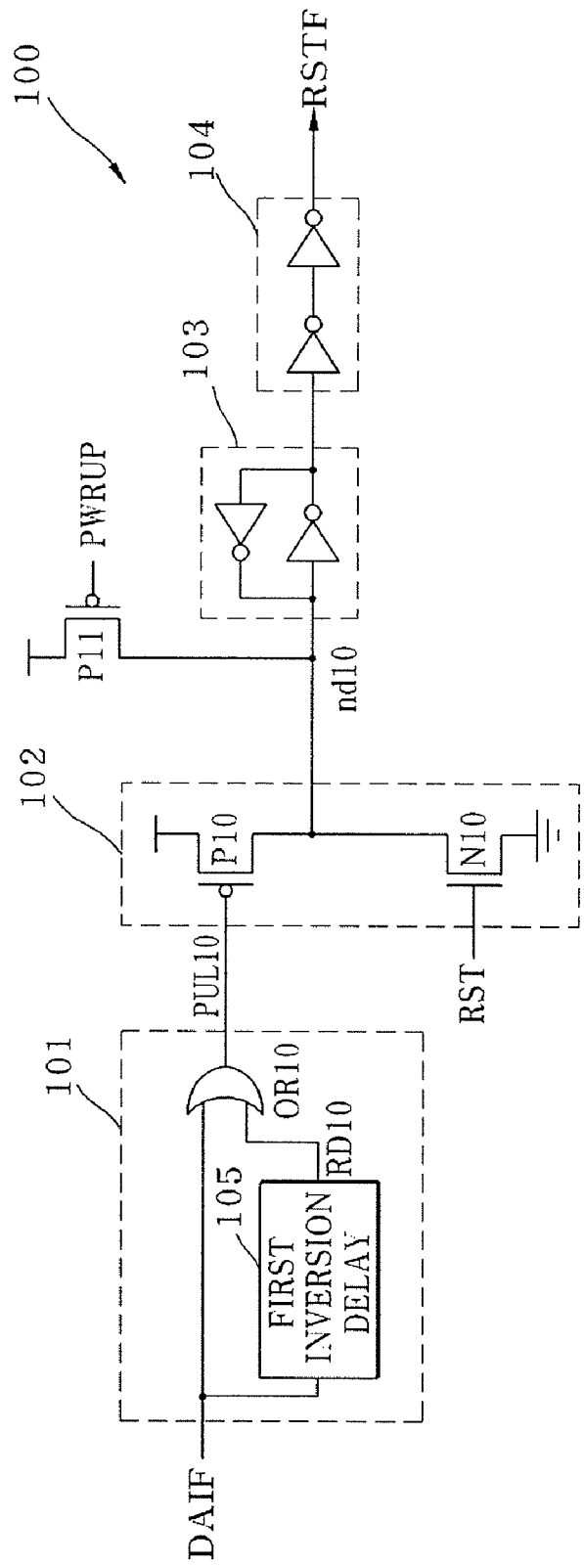
FIG. 8 is a circuit diagram illustrating a first flag signal generation unit of FIG. 7.

As illustrated in FIG. 8, the first flag signal generation unit 100 includes a first pulse generation section 101, a first driving section 102, a first latch section 103, and a first buffer section 104. The first pulse generation section 101 includes a first inversion delay 105 and a first OR gate OR10. The first inversion delay 105 is configured to invert and delay a device auto initialization flag signal DAIF and output a first inversion delay signal RD10. The first OR gate OR10 is configured to perform an OR operation on the device auto initialization flag signal DAIF and the first inversion delay signal RD10 and generate a pulse of a first pulse signal PUL10. The first driving section 102 includes a first NMOS transistor N10 and a first PMOS transistor P10. The first NMOS transistor N10 is configured to operate as a pull-down element to pull-down drive a first node nd10 in response to a reset command RST. The first PMOS transistor P10 is configured to operate as a pull-up element to pull-up drive the first node nd10 in response to the first pulse signal PUL10. The first latch section 103 is configured as an inverter type latch which latches a signal of the first node nd10. The first buffer unit 104 is configured as an inverter type buffer which delays and buffers the output signal of the first latch section 103 and outputs a reset flag signal RSTF. The first flag signal generation unit 100 further includes a second PMOS transistor P11 configured to operate as a reset element to reset the first node nd10 in response to a power-up signal PWRUP. The reset command RST is a command which allows the semiconductor memory device to enter a reset state in a specific situation. An example of the specific situation is a case in which an external controller malfunctions and therefore only the external controller is rebooted. In this case, transfers the reset command RST to the semiconductor memory device and allows the semiconductor memory device to enter the reset state.

The first flag signal generation unit 100 configured as above enables a reset flag signal RSTF to a high level when the pulse of the reset command RST is generated, and disables the reset flag signal RSTF to a low level when the device auto initialization flag signal DAIF is disabled to a low level. Specifically, when the pulse of the reset command RST is inputted, the first NMOS transistor N10 of the first driving section 102 is driven to pull down the first node nd10 to a low level. The first latch section 103 latches and inverts the low level signal of the first node nd10, and the first buffer section 104 delays and buffers the output signal of the first latch section 103 and enables the reset flag signal RSTF to a high level. When the pulse of the first pulse signal PUL10 is generated at a time where the device auto initialization flag signal DAIF is disabled to a low level, the first PMOS transistor P10 of the first driving section 102 is driven to pull up the first node nd10 to a high level. The first latch section 103 latches and inverts the high level signal of the first node nd10, and the first buffer section 104 delays and buffers the output signal of the first latch section 103 and disables the reset flag signal RSTF to a low level.

Figure 9:
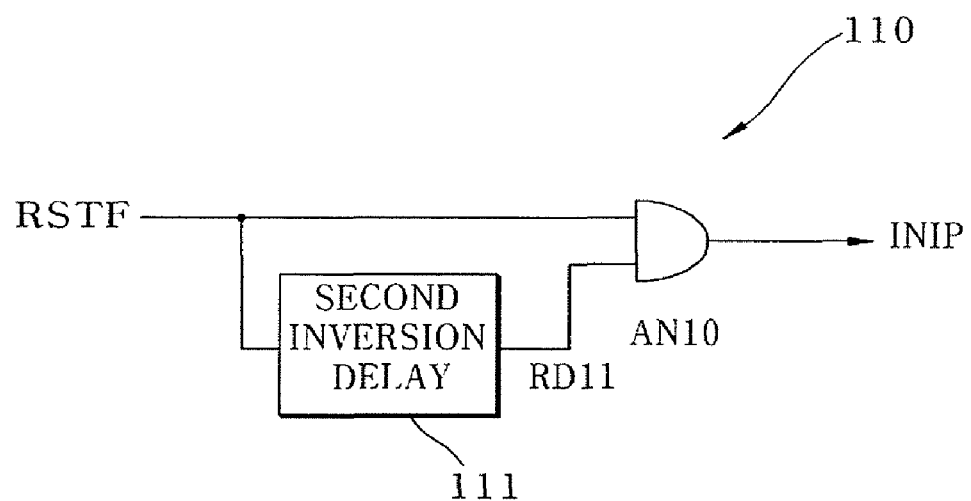
FIG. 9 is a circuit diagram illustrating a first initial pulse signal generation unit of FIG. 7.

As illustrated in FIG. 9, the initial pulse signal generation unit 110 includes a second inversion delay 111 and a first AND gate AN10. The second inversion delay 111 is configured to invert and delay the reset flag signal RSTF and output a second inversion delay signal RD11. The first AND gate AN10 is configured to perform an AND operation on the reset flag signal RSTF and the second inversion delay signal RD11 and generate a pulse of a first initial pulse signal INIP.

The initial pulse signal generation unit 110 configured as above generates the pulse of the first initial pulse signal INIP when the reset flag signal RSTF is enabled to a high level.

Figure 10:
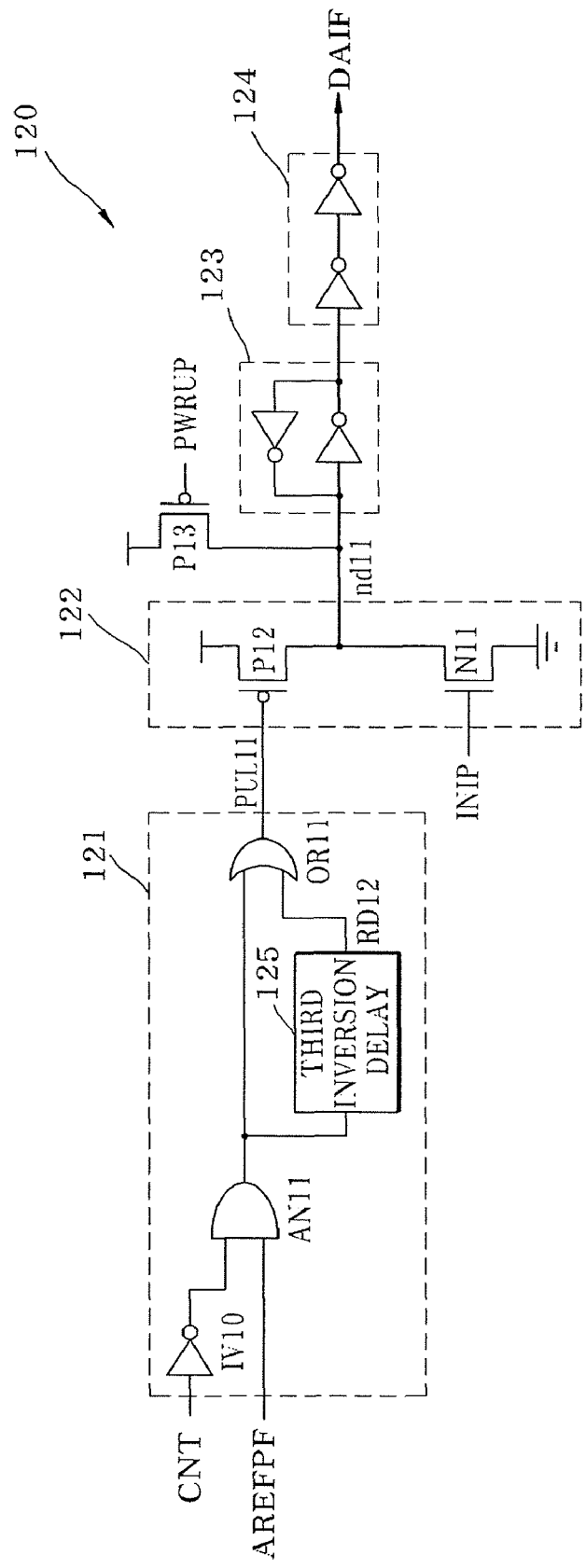
FIG. 10 is a circuit diagram illustrating a second flag signal generation unit of FIG. 7.

As illustrated in FIG. 10, the second flag signal generation unit 120 includes a second pulse generation section 121, a second driving section 122, a second latch section 123, and a second buffer section 124. The second pulse generation section 121 includes a first inverter IV10, a second AND gate AN11, a third inversion delay 125, and a second OR gate OR11. The first inverter IV10 is and a second OR gate OR11 configured to invert a counting signal CNT. The second AND gate AN11 is configured to perform an AND operation on an output signal of the first inverter IV10 and an internal refresh command AREFPF. The third inversion delay 125 is configured to invert and delay an output signal of the second AND gate AN11 and output a third inversion delay signal RD12. The second OR gate OR11 is configured to perform an OR operation on the output signal of the second AND gate AN11 and the third inversion delay signal RD12 and generate a pulse of a second pulse signal PUL11. The second driving section 122 includes a second NMOS transistor N11 and a third PMOS transistor P12. The second NMOS transistor N11 is configured to operate as a pull-down element to pull-down drive a second node nd11 in response to the pulse of the first initial pulse signal INIP. The third PMOS transistor P12 is configured to operate as a pull-up element to pull-up drive the second node nd11 in response to the pulse of the second pulse signal PUL11. The second latch section 123 is configured with an inverter type latch which latches the signal of the second node nd11. The second buffer section 124 is configured with an inverter type buffer which delays and buffers the output signal of the second latch section 123 and outputs the device auto initialization flag signal DAIF. The second flag signal generation unit 120 further includes a fourth PMOS transistor P13 configured to operate as a reset circuit to reset the second node nd11 in response to the power-up signal PWRUP.

The second flag signal generation unit 120 enables the device auto initialization flag signal DAIF to a high level when the pulse of the first initial pulse signal INIP is generated, and disables the device auto initialization flag signal DAIF to a low level when the counting signal CNT and the internal refresh command AREFPF are at a low level and a high level, respectively. Specifically, when the pulse of the first initial pulse signal INIP is generated, the second NMOS transistor N11 of the second driving section 122 is driven to pull down the second node nd11 to a low level. The second latch section 123 latches and inverts the low level signal of the second node nd11, and the second butter section 124 delays and buffers the output signal of the second latch section 123 and enables the device auto initialization flag signal DAIF to a high level. When the pulse of the second pulse signal PUL11 is generated at a timing where the counting signal CNT and the internal refresh command AREFPF become a low level and a high level, respectively, the third PMOS transistor P12 of the second driving section 122 is driven to pull up the second node nd11 to a high level. The second latch section 123 latches and inverts the high level signal of the second node nd11, and the second buffer 124 delays and buffers the output signal of the second latch section 123 and disables the device auto initialization flag signal DAIF to a low level.

Figure 11:
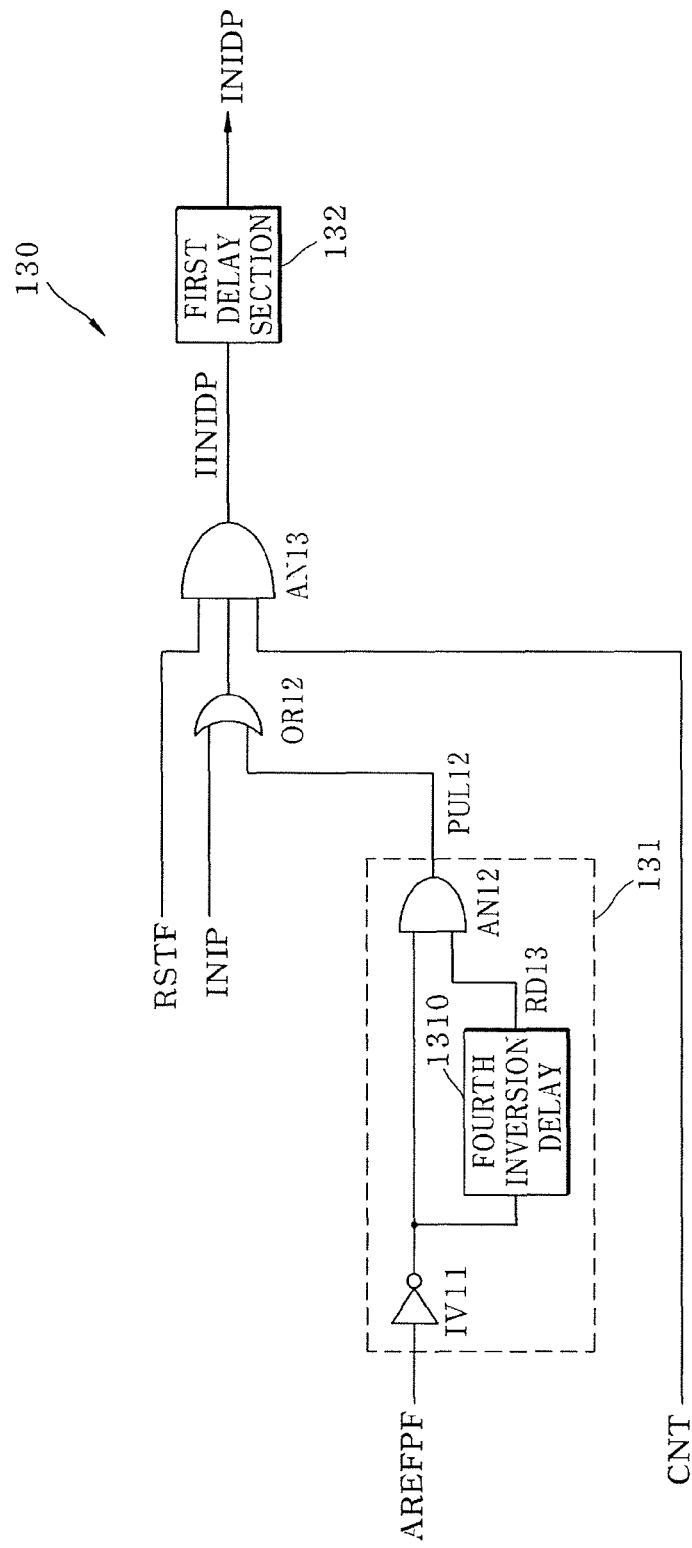
FIG. 11 is a circuit diagram illustrating a second initial pulse signal generation unit of FIG. 7.

As illustrated in FIG. 11, the second initial pulse signal generation unit 130 includes a third pulse generation section 131, a third OR gate OR12, a fourth AND gate AN13, and a first delay section 132. The third pulse generation section 131 is configured to generate a pulse of a third pulse signal PUL12 in response to the internal refresh command AREFPF. The third OR gate OR12 is configured to perform an OR operation on the first initial pulse signal INIP and the third pulse signal PUL12. The fourth AND gate AN13 is configured to perform an AND operation on the refresh flag signal RSTF, the third pulse signal PUL12, and the counting signal CNT and generate a pulse of a second pre initial pulse signal IINIDP. The first delay section 132 is configured to delay the second pre initial pulse signal IINIDP and generate the pulse of the second initial pulse signal INIDP. The third pulse generation section 131 includes a second inverter IV11, a fourth inversion delay 1310, and a third AND gate AN12. The second inverter IV11 is configured to invert the internal refresh command AREFPF. The fourth inversion delay 1310 is configured to invert and delay an output signal of the second inverter IV11 and output a fourth inversion delay signal RD13. The third AND gate AN12 is configured to perform an AND operation on the output signal of the second inverter IV11 and the fourth inversion delay signal RD13 and generate the pulse of the third pulse signal PUL12.

The second initial pulse signal generation unit 130 generates the pulse of the second initial pulse signal INIDP in response to the pulse of the first initial pulse signal INIP in a time period where the reset flag signal RSTF and the counting signal CNT are at a high level and the internal refresh command AREFPF is at a low level. Next, the second initial pulse signal generation unit 130 generates the pulse of the second initial pulse signal INIDP in response to the high-to-low transition of the internal refresh command AREFPF in a time period where the reset flag signal RSTF and the counting signal CNT are at a high level. Next, the second initial pulse signal generation unit 130 generates the pulse of the second initial pulse signal INIDP in response to the high-to-low transition of the internal refresh command AREFPF in a time period where the refresh flag signal RSTF and the counting signal CNT are at a high level. The second initial pulse signal generation unit 130 continues to generate the pulse of the second initial pulse signal INIDP and then stops generating the pulse of the second initial pulse signal INIDP in response to the high-to-low transition of the counting signal CNT. When assuming that the refresh operation is performed eight times, the pulse of the second initial pulse signal INIDP is generated eight times and then its generation is stopped by the counting signal CNT. For convenience, it is assumed hereinafter that the refresh operation is performed eight times.

Figure 12:
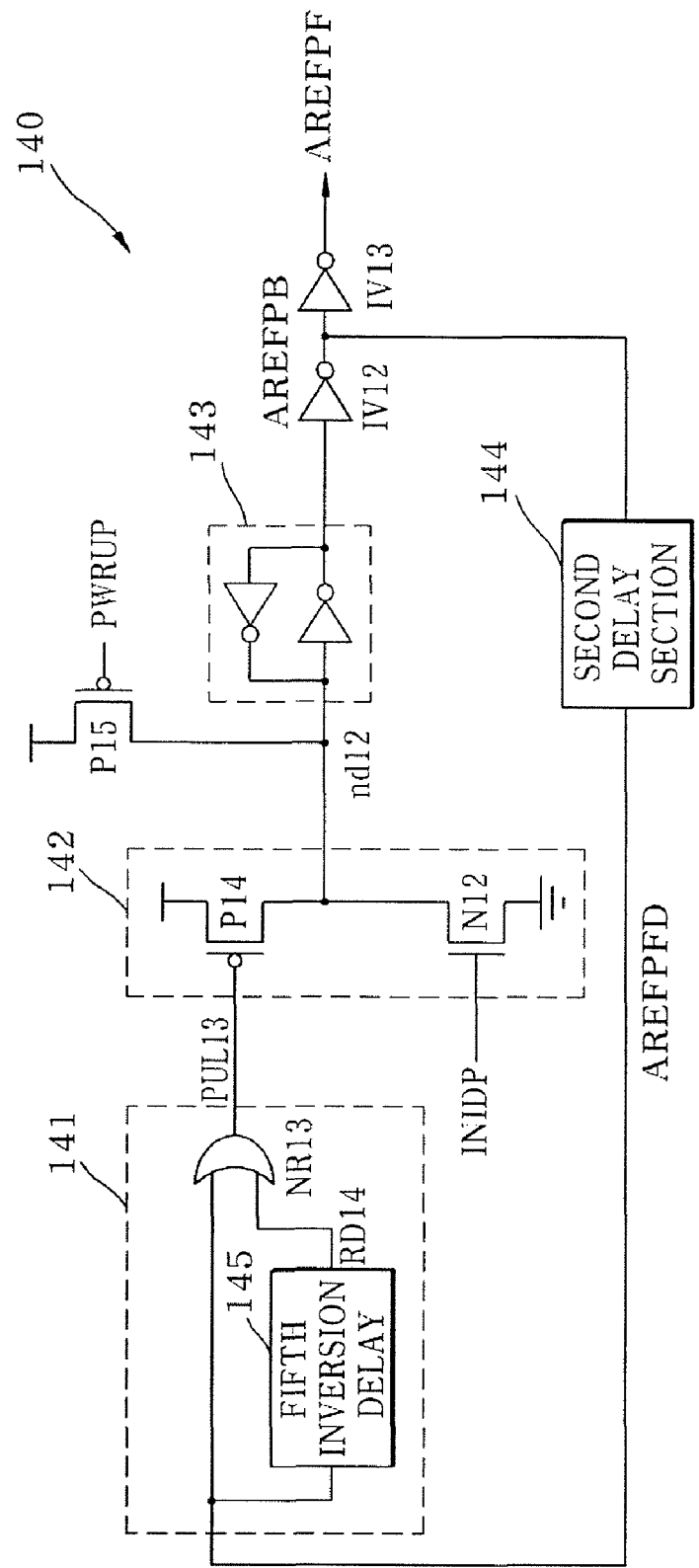
FIG. 12 is a circuit diagram illustrating an internal command generation unit of FIG. 7.

As illustrated in FIG. 12, the internal command generation unit 140 includes a fourth pulse generation section 141, a third driving section 142, a third latch section 143, third and fourth inverters IV12 and IV13, and a second delay section 144. The fourth pulse generation section 141 includes a fifth inversion delay 145, and a fourth OR gate OR13. The fifth inversion delay 145 is configured to invert and delay the first delay signal AREFPFD and output a fifth inversion delay signal RD14. The fourth OR gate OR13 is configured to perform an OR operation on the first delay signal AREFPFD and the fifth inversion delay signal RD14 and generate a pulse of a fourth pulse signal PUL13. The third driving section 142 includes a third NMOS transistor N12 and a fifth PMOS transistor P14. The third NMOS transistor N12 is configured to operate as a pull-down element to pull-down drive the third node nd12 in response to the second initial pulse signal INIDP. The fifth PMOS transistor P14 is configured to operate as a pull-up element to pull-up drive the third node nd12 in response to the pulse of the fourth pulse signal PUL13. The third latch section 143 is configured with an inverter type latch which latches the signal of the third node nd12. The third inverter IV12 is configured to invert an output signal of the third latch section 143 and output a pre internal refresh command AREFPB, and the fourth inverter IV13 is configured to invert the pre internal refresh command AREFPB and output the internal refresh command AREFPF. The second delay section 144 is configured to delay the pre internal refresh command AREFPB by the refresh time (tRFC) and output the first delay signal AREFPFD. The internal command generation unit 140 further includes a sixth PMOS transistor P15 configured to operate as a reset circuit to reset the third node nd12 in response to the power-up signal PWRUP.

The internal command generation unit 140 enables the internal refresh command AREFPF to a high level when the pulse of the second initial pulse signal INIDP is generated, and disables the internal refresh command AREFPF to a low level after the elapse of the refresh time (tRFC). Specifically, when the pulse of the second initial pulse signal INIDP is generated, the third NMOS transistor N12 of the third driving section 142 is driven to pull down the third node nd12 to a low level. The third latch section 143 latches and inverts the low level signal of the third node nd12, and the first and second inverters IV1 and IV2 delay and buffer the output signal of the third latch section 143 and enable the internal refresh command AREFPF to a high level. When the pulse of the fourth pulse signal PUL13 is generated at a timing where the first delay signal AREFPFD generated by delaying the pre internal refresh command AREFPB outputted from the first inverter IV12 by the refresh time is enabled to a low level, the fifth PMOS transistor P14 of the third driving section 142 is driven to pull up the third node nd12 to a high level. The third latch section 143 latches and inverts the high level signal of the third node nd12, and the first and second inverters IV12 and IV13 delay and buffer the output signal of the third latch section 143 and enable the internal refresh command AREFPF to a low level.

Figure 13:
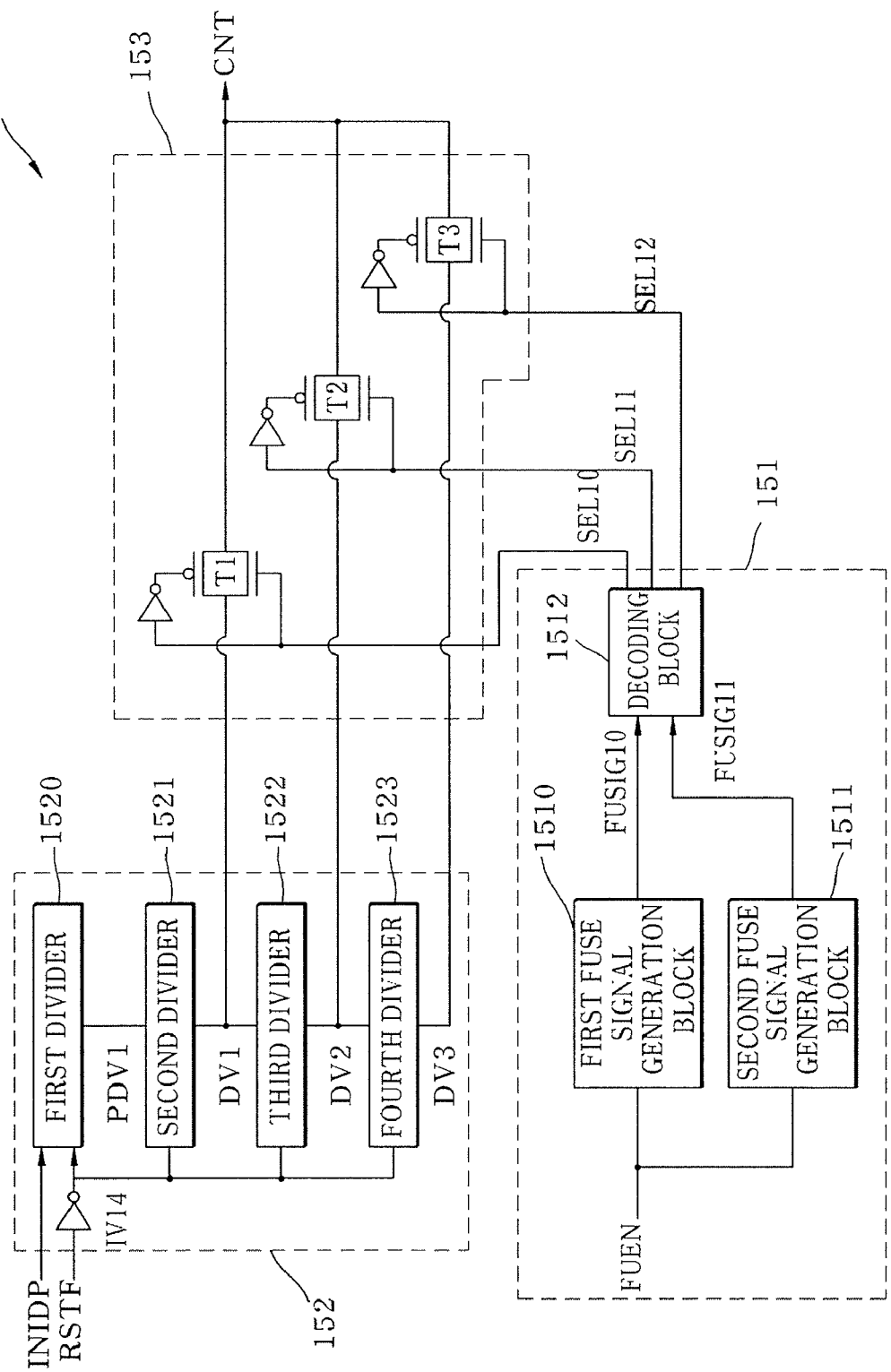
FIG. 13 is a circuit diagram illustrating a counting unit of FIG. 7.
Figure 14:
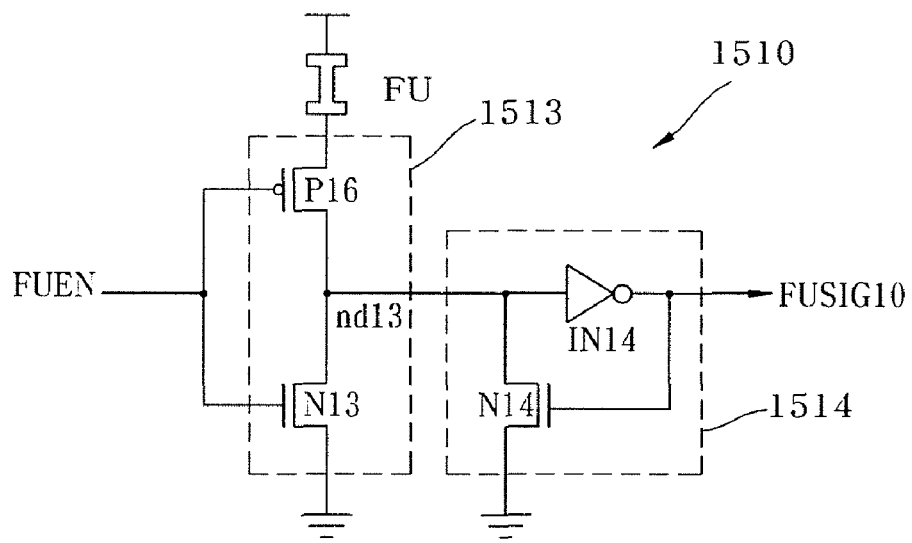
FIG. 14 is a circuit diagram illustrating a first fuse signal generation unit of FIG. 13.

As illustrated in FIG. 13, the counting unit 150 includes a fuse section 151, an initial counting signal generation section 152, and a selection section 173. The fuse section 151 includes a first fuse signal generation block 1510, a second fuse signal generation block 1511, and a decoding block 1512. As illustrated in FIG. 14, the first fuse signal generation block 1510 includes a fuse FU, a fourth driver 1513, and a fourth latch 1514. The fuse FU is disposed between the power supply voltage terminal and a seventh PMOS transistor P16 of the fourth driver 1513. The fourth driver 1513 includes a seventh PMOS transistor P16 configured to operate as a pull-up element to pull-up drive a fourth node nd13 in response to a fuse enable signal FUEN, and a fourth NMOS transistor N13 configured to operate as a pull-down element to pull-down drive the fourth node nd13 in response to the fuse enable signal FUEN. The fourth latch 1514 includes a fifth inverter IV14 configured to invert the signal of the fourth node nd13 and output a first fuse signal FUSIG10, and a fifth NMOS transistor N14 configured to lock a level of the first fuse signal FUSIG10 when the first fuse signal FUSIG10 becomes a high level. The second fuse signal generation block 1511 is implemented with the same circuit configuration as the first fuse signal generation block 1510, except for the output signal. The decoding block 1512 is configured to decode the first fuse signal FUSIG10 and the second fuse signal FUSIG11 and output first to third selection signals SEL10 to SEL12. Table 1 below shows levels of the first and second fuse signals FUSIG10 and FUSIG11 inputted to the decoding block 1512 and levels of the first to third selection signals SEL10 to SEL12 outputted from the decoding block 1512.

TABLE 1

| FUSIG10 | FUSIG11 | SEL10 | SEL11 | SEL12 |
|---------|---------|-------|-------|-------|
| H | H | H | L | L |
| H | L | L | H | L |
| L | H | L | L | H |
| L | L | L | L | L |

Referring to Table 1 above, when both the first fuse signal FUSIG10 and the second fuse signal FUSIG11 become a high level, only the first selection signal SEL10 is enabled to a high level. When the first fuse signal FUSIG10 and the second fuse signal FUSIC11 become a high level and a low level, respectively, only the second selection signal SEL11 is enabled to a high level. When the first fuse signal FUSIG10 and the second fuse signal FUSIG11 become a low level and a high level, respectively, only the third selection signal SEL12 is enabled to a high level. When both the first fuse signal FUSIG10 and the second fuse signal FUSIG11 become a low level, the first to third selection signals SEL10 to SEL12 are disabled to a low level. Thus, the fuses FU within the first fuse signal generation block 1510 and the second fuse signal generation block 1511 must be all cut or selectively cut.

The initial counting signal generation section 152 includes a first divider 1520, a second divider 1521, a third divider 1522, and a fourth divider 1523. The first divider 1520 is configured to be reset by the reset flag signal RSTF which is inverted by a fifth inverter IV14, divide the second initial pulse signal INIDP by two, and output a pre initial counting signal PDV1. The second divider 1521 is configured to be reset by the inversion signal of the reset flag signal RSTF, divide the pre initial counting signal PDV1 by two, and output a first initial counting signal DV1. The third divider 1522 is configured to be reset by the inversion signal of the reset flag signal RSTF, divide the first initial counting signal DV1 by two, and output a second initial counting signal DV2. The fourth divider 1523 is configured to be reset by the inversion signal of the reset flag signal RSTF, divide the second initial counting signal DV2 by two, and output a third initial counting signal DV3. The selection section 153 includes a first transmission gate T1 configured to output the first initial counting signal DV1 as the counting signal CNT in response to the first selection signal SEL10, a second transmission gate T2 configured to output the second initial counting signal DV2 as the counting signal CNT in response to the second selection signal SEL2, and a third transmission gate T3 configured to output the third initial counting signal DV3 as the counting signal in response to the third selection signal SEL3. The design of the first to third transmission gates T1 to T3 may be modified with a device such as a three-phase input buffer which can transfer a corresponding signal in response to a control signal.

Figure 15:
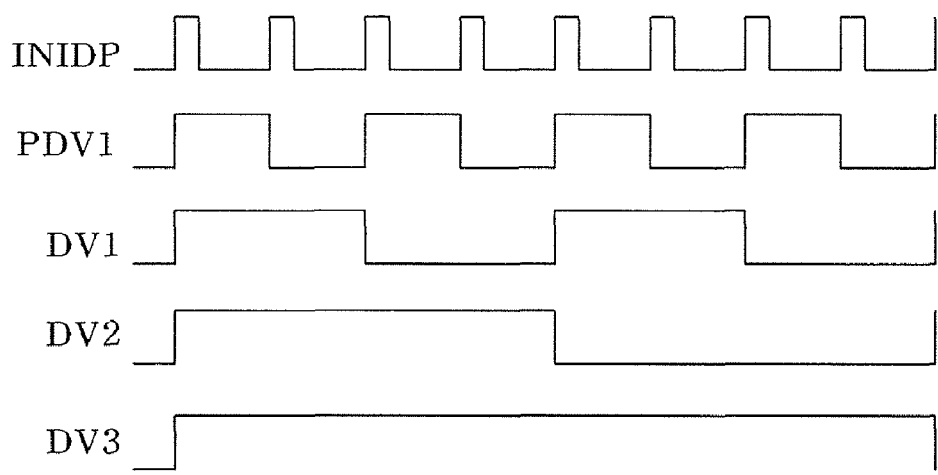
FIG. 15 is a timing diagram of first to third initial counting signals which are outputted from the counting unit of FIG. 13.

The counting unit 150 generates the first and second fuse signals FUSIG10 and FUSIG11 having preset levels through fuse cutting, and enables one of the first to third selection signals SEL10 to SEL12 to a high level. In order to perform the refresh operation eight times, the second initial pulse signal INIDP must be enabled eight times. The first fuse signal FUSIG10 of a low level and the second fuse signal FUSIG11 of a high level are generated by cutting only the fuse of the second fuse signal generation block 1511. Therefore, as shown in Table 1, only the third selection signal SEL12 is enabled to a high level. When the third selection signal SEL12 is enabled to a high level, the third initial counting signal DV3 generated by dividing the second initial pulse signal INIDP by sixteen is outputted as the counting signal CNT. Referring to FIG. 15 illustrating the timing diagram of the first to third initial counting signals DV1 to DV3, it can be checked that the pulse of the second initial pulse signal INIDP is generated eight times within the enable period of the third initial counting signal DV3 which is generated by dividing the second initial pulse signal INIDP by sixteen. Therefore, the counting unit 150 allows the pulse of the second initial pulse signal INIDP to be generated only eight times by outputting the third initial counting signal DV3 as the counting signal CNT.

The state signal generation unit 160 includes a mode register 161 and a DQ controller 162. The mode register 161 outputs a state signal OP according to the level of the device auto initialization flag signal DAIF in response to a mode register read command MRR. For example, in such a state that the mode register read command MRR is inputted, the mode register 161 changes the state signal OP to a high level when the device auto initialization flag signal DAIF is at a high level, and changes the state signal OP to a low level when the device auto initialization flag signal DAIF is at a low level. The DQ controller 162 transfers a DQ signal DQ0 to a DQ pad in response to the level of the state signal OP. The DQ signal DQ0 transferred to the DQ pad is outputted to an external controller.

When the mode register read command MRR is inputted from the external controller, the state signal generation unit 160 changes the DQ signal DQ0 to a high level when the device auto initialization flag signal DAIF is at a high level, and transfers the DQ signal DQ0 to the DQ pad. On the other hand, when the device auto initialization flag signal DAIF is at a low level, the state signal generation unit 160 changes the DQ signal DQ0 to a low level and transfers the DQ signal DQ0 to the DQ pad. That is, when the semiconductor memory device enters the device auto initialization mode, the DQ signal DQ0 is changed to a high level. When the semiconductor memory device exits the device auto initialization mode, the DQ signal DQ0 is changed to a low level and transferred to the DQ pad. The DQ signal DQ0 transferred to the DQ pad is outputted to the external controller, thus informing whether the semiconductor memory device enters or exits the device auto initialization mode.

Figure 16:
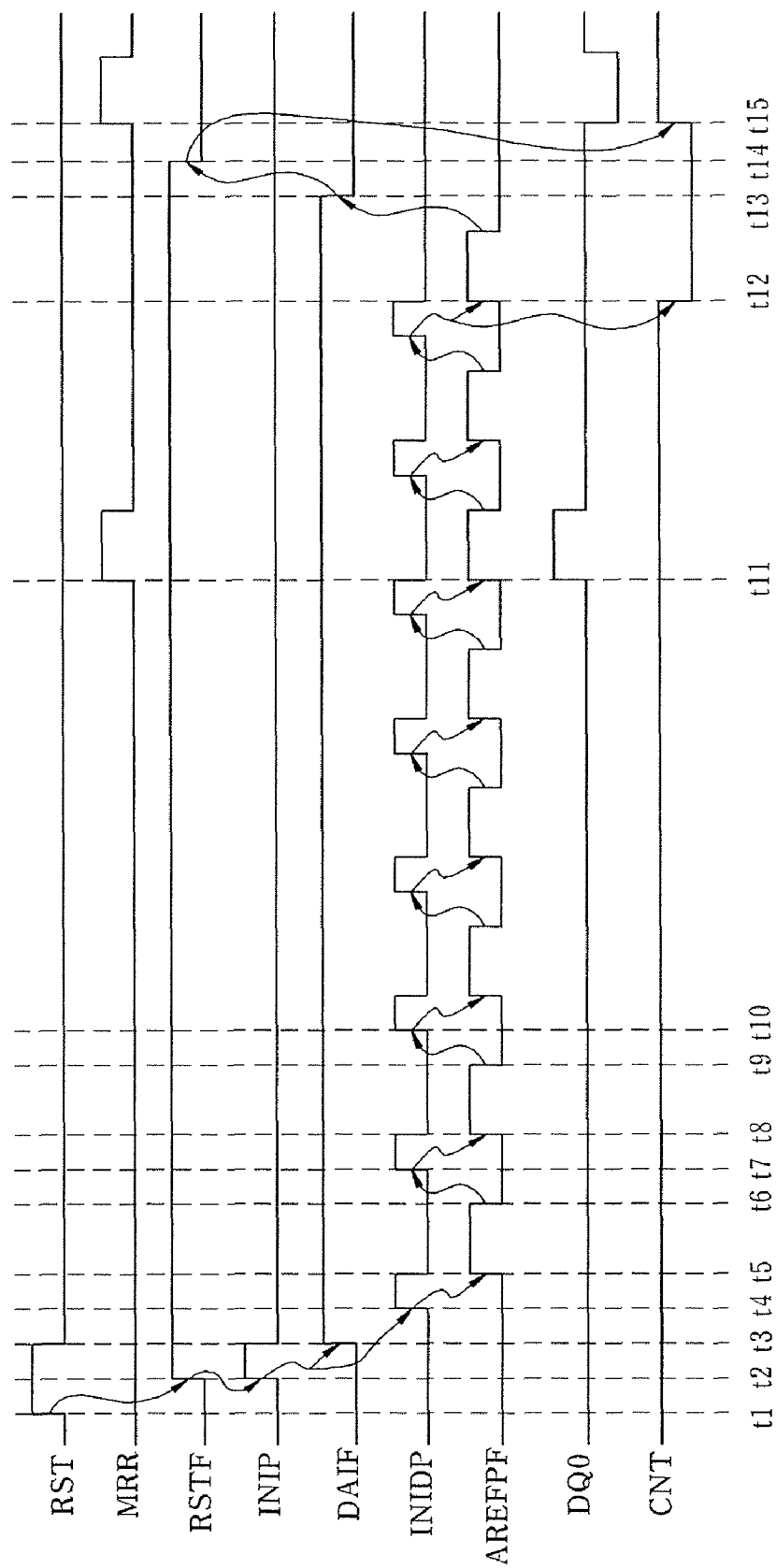
FIG. 16 is a timing diagram illustrating the operation of the internal command generation device of FIG. 7.

The operation of the internal command generation device configured as above will be described below with reference to FIG. 16.

First, when the pulse of the reset command RST is inputted at time t1, the first flag signal generation unit 100 enables the reset flag signal RSTF to a high level at time t2. Specifically, when the pulse of the reset command RST is inputted at time t1, the first NMOS transistor N10 of the first driving section 102 is driven to pull down the first node nd10 to a low level. The first latch section 103 latches and inverts the low level signal of the first node nd10, and the first buffer section 104 delays and buffers the output signal of the first latch section 103 and enables the reset flag signal RSTF to a high level at time t2. The reset period is started in response to the reset flag signal RSTF which is enabled to a high level.

Next, when the reset flag signal RSTF is enabled to a high level at time t2, the first initial pulse signal generation section 110 generates the pulse of the first initial pulse signal INIP at time t2.

Next, when the pulse of the first initial pulse signal INIP is generated at time t2, the second flag signal generation section 102 enables the device auto initialization flag signal DAIF to a high level at time t3. Specifically, when the pulse of the first initial pulse signal INIP is generated at time t2, the second NMOS transistor N11 of the second driving section 122 is driven to pull down the second node nd11 to a low level. The second latch section 123 latches and inverts the low level signal of the second node nd11, and the second buffer section 124 delays and buffers the output signal of the second latch section 123 and enables the device auto initialization flag signal DAIF to a high level at time t3. The device auto initialization period is started in response to the device auto initialization flag signal DAIF which is enabled to a high level.

Next, the second initial pulse signal generation unit 130 generates the pulse of the second initial pulse signal INIDP at time t4 in a time period where the pulse of the first initial pulse signal INIP is generated at time t2 and the counting signal CNT and the internal refresh command AREFPF are at a high level and a low level, respectively.

Next, when the pulse of the second initial pulse signal INIDP is generated at time t4, the internal command generation unit 140 enables the internal refresh command AREFPF to a high level at time t5, and disables the internal refresh command AREFPF to a low level at time t6 after the elapse of the refresh time (tRFC). Specifically, when the pulse of the second initial pulse signal INIDP is generated at time t4, the third NMOS transistor N12 of the third driving section 142 is driven to pull down the third node nd12 to a low level. The third latch section 143 latches and inverts the low level signal of the third node nd12, and the first and second inverters IV1 and IV2 delay and buffer the output signal of the third latch section 143 and enable the internal refresh command AREFPF to a high level at time t5. Then, when the pulse of the fourth pulse signal PUL13 is generated at a timing where the first delay signal AREFPFD generated by delaying the pre internal refresh command AREFPB outputted from the first inverter IV1 by the refresh time is enabled to a low level, the fifth PMOS transistor P14 of the third driving section 142 is driven to pull up the third node nd3 to a high level. The third latch section 143 latches and inverts the high level signal of the third node nd3, and the first and second inverters IV1 and IV2 delay and buffer the output signal of the third latch section 143 and disable the internal refresh command AREFPF to a low level at time t6.

Next, the second initial pulse signal generation unit 130 generates the pulse of the second initial pulse signal INIDP at time t7 at a timing where the internal refresh command AREFPF is disabled to a low level at time t6 and the reset flag signal RSTF and the counting signal CNT are at a high level. When the pulse of the second initial pulse signal INIDP is generated, the internal command generation unit 140 enables the internal refresh command AREFPF to a high level at time t8, and disables the internal refresh command AREFPF to a low level at time t9 after the elapse of the refresh time (tRFC). When the internal refresh command AREFPF is disabled to a low level at time t9, the second initial pulse signal generation unit 130 generates the pulse of the second initial pulse signal INIDP at time t10 in a time period where the reset flag signal RSTF and the counting signal CNT are at a high level. The second initial pulse signal generation unit 130 and the internal command generation unit 140 repeat the above operations to sequentially generate the pulse of the second initial pulse signal INIDP and the internal refresh command AREFPF.

Next, when the pulse of the second initial pulse signal INIDP is generated preset number of times, that is, eight times, the counting signal CNT changes from a high level to a low level at time t12. The second initial pulse signal generation unit 130 stops generating the pulse of the second initial pulse signal INIDP in response to the high-to-low transition of the counting signal CNT. Therefore, after the pulse of the second initial pulse signal INIDP is generated eight times, it is not generated any more. Also, after the internal refresh command AREFPF is enabled eight times, it maintains a disabled state.

Next, the second flag signal generation unit 120 disables the device auto initialization flag signal DAIF to a low level at time t13 in response to the counting signal CNT, which changes to a low level at time t12, and the internal refresh command AREFPF of a high level. Specifically, when the pulse of the second pulse signal PUL11 is generated at a timing where the counting signal CNT and the internal refresh command AREFPF become a low level and a high level, respectively, the third PMOS transistor P12 of the second driving section 122 is driven to pull up the second node nd11 to a high level. The second latch section 123 latches and inverts the high level signal of the second node nd11, and the second buffer section 124 delays and buffers the output signal of the second latch section 123 and disables the device auto initialization flag signal DAIF to a low level at time t13.

Next, when the device auto initialization flag signal DAIF is disabled to a low level at time t13, the first flag signal generation unit 100 disables the reset flag signal RSTF to a low level at time t14. Specifically, when the device auto initialization flag signal DAIF is disabled to a low level at time t13, the pulse of the first pulse signal PUL10 is generated to drive the first PMOS transistor P10 of the first driving section 102. Therefore, the first node nd10 is pulled up to a high level. The first latch section 103 latches and inverts the high level signal of the first node nd10, and the first buffer section 104 delays and buffers the output signal of the first latch section 103 and disables the reset flag signal RSTF to a low level at time t14.

Next, when the reset flag signal RSTF is disabled to a low level at time t14, the counting unit 150 changes the counting signal CNT from a low level to a high level at time t15.

Meanwhile, when the mode register read command MRR is enabled to a high level at time t11, the state signal generation unit 160 changes the DQ signal DQ0 to a high level in response to the device auto initialization flag signal RSTF which is enabled to a high level. When the mode register read command MRR is enabled to a high level at time t15, the state signal generation unit 160 changes the DQ signal DQ0 to a low level in response to the device auto initialization flag signal RSTF which is disabled to a low level. The outputted DQ signal DQ0 is transferred to the external controller, notifying whether the device auto initialization period is proceeded or ended.

In summary, the internal command generation device according to the embodiment of the present invention sets the reset period and the device auto initialization period by sequentially generating the reset flag signal RSTF and the device auto initialization flag signal DAIF when the pulse of the reset command RST is inputted, and guides a plurality of refresh operations by generating the internal refresh command AREFPF which is enabled multiple times within the device auto initialization period. Therefore, when the pulse of the reset command is received, the internal command generation device according to the embodiment of the present invention performs the refresh operation by generating the plurality of internal refresh commands AREFPF, thereby stabilizing the internal voltage. In this case, the internal refresh command AREFPF may be generated predetermined times enough the internal voltage can be stabilized.

Meanwhile, the internal refresh command AREFPF may be generated using an oscillator. However, the oscillator of the recent semiconductor memory device in which the enable period of the internal refresh command AREFPF, that is, the refresh time (tRFC) is set to 130 ns or less is sensitive to environment factors (fabrication process, temperature, voltage). Thus, it is difficult to ensure the refresh time (tRFC). However, since the internal command generation device according to another embodiment of the present invention generates the internal refresh command AREFPF by using a pulse generator, the refresh time (tRFC) can be sufficiently ensured.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An internal command generation device, comprising:
a first flag signal generation unit configured to generate a reset flag signal setting a reset period in response to a reset command;
an initial pulse signal generation unit configured to generate a first initial pulse signal and a second initial pulse signal in response to the reset flag signal;
a second flag signal generation unit configured to generate a device auto initialization flag signal setting a device auto initialization period in response to the first initial pulse signal;
an internal command generation unit configured to generate an internal refresh command enabled within the device auto initialization period in response to the second initial pulse signal; and
wherein the reset flag signal is enabled in response to the reset command and disabled in response to the device auto initialization flag signal.

2. The internal command generation device of claim 1, wherein the device auto initialization flag signal is enabled in response to the first initial pulse signal and disabled in response to the internal refresh command.

3. The internal command generation device of claim 1, wherein the internal refresh command is enabled for a refresh time.

4. The internal command generation device of claim 1, wherein the first initial pulse signal is generated before the second initial pulse signal.

5. The internal command generation device of claim 1, wherein the first flag signal generation unit comprises:
a first pulse generation section configured to generate a first pulse signal in response to the device auto initialization flag signal;
a first driving section configured to drive a first node in response to the reset command and the first pulse signal;
a first latch section configured to latch a signal of the first node; and
a first buffer section configured to delay and buffer an output signal of the first latch section and output a reset flag signal.

6. The internal command generation device of claim 5, wherein the first pulse signal generation section comprises:
a first inversion delay configured to invert and delay the device auto initialization flag signal and output a first inversion delay signal; and
a first logic element configured to perform an OR operation on the device auto initialization flag signal and the first inversion delay signal and output the first pulse signal.

7. The internal command generation device of claim 5, wherein the first driving section comprises:
a first pull-up element configured to pull-up drive the first node in response to the first pulse signal; and
a first pull-down element configured to pull-down drive the first node in response to the reset command.

8. The internal command generation device of claim 1, wherein the initial pulse signal generation unit comprises:
a second pulse generation section configured to output the first initial pulse signal in response to the reset flag signal; and
a first delay section configured to delay the first initial pulse signal and output the second initial pulse signal.

9. The internal command generation device of claim 8, wherein the second pulse generation section comprises:
a second inversion delay configured to invert and delay the reset flag signal and output a second inversion delay signal; and
a second logic element configured to perform an AND operation on the reset flag signal and the second inversion delay signal and output the first initial pulse signal.

10. The internal command generation device of claim 1, wherein the second flag signal generation unit comprises:
a third pulse generation section configured to generate a second pulse signal in response to the internal refresh command;
a second driving section configured to drive a second node in response to the first initial pulse signal and the second pulse signal;
a second latch section configured to latch a signal of the second node; and
a second buffer section configured to delay and buffer an output signal of the second latch section and output the device auto initialization flag signal.

11. The internal command generation device of claim 10, wherein the third pulse generation section comprises:
a third inversion delay configured to invert and delay the internal refresh command and output a third inversion delay signal; and a third logic element configured to perform an OR operation on the internal refresh command and the third inversion delay signal and output the second pulse signal.

12. The internal command generation device of claim 10, wherein the second driving section comprises: a second pull-up element configured to pull-up drive the second node in response to the second pulse signal; and a second pull-down element configured to pull-down drive the second node in response to the first initial pulse signal.

13. The internal command generation device of claim 1, wherein the internal command generation unit comprises:
   a fourth pulse generation section configured to output a third pulse signal in response to a first delay signal;
   a third driving section configured to drives a third node in response to the second initial pulse signal and the third pulse signal and output the internal refresh command;
   a third latch section configured to latch a signal of the third node;
   a first inverter configured to invert an output signal of the third latch section;
   a second inverter configured to invert an output signal of the first inverter and output the internal refresh command; and
   a second delay section configured to delay the output signal of the first inverter and output the first delay signal.

14. The internal command generation device of claim 13, wherein the fourth pulse generation section comprises:
   a fourth inversion delay configured to invert and delay the first delay signal and output a fourth inversion delay signal; and
   a fourth logic element configured to perform an OR operation on the first delay signal and the fourth inversion delay signal and output the third pulse signal.

15. The internal command generation device of claim 13, wherein the third driving section comprises:
   a third pull-up element configured to pull-up drive the third node in response to the third pulse signal; and
   a third pull-down element configured to pull-down drive the third node in response to the second initial pulse signal.

16. The internal command generation device of claim 13, wherein the second delay section has a delay time corresponding to a refresh time.

* * * * *